(12) United States Patent
Chiu et al.

(10) Patent No.: US 6,777,340 B1
(45) Date of Patent: Aug. 17, 2004

(54) METHOD OF ETCHING A SILICON CONTAINING LAYER USING MULTILAYER MASKS

(75) Inventors: Hsien-Kuang Chiu, Taoyuan (TW); Fang-Chang Chen, Hsin-chu (TW); Hun-Jan Tao, Hsinchu (TW); Yuan-Hung Chiu, Taipei (TW); Jeng-Horng Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 23 days.

(21) Appl. No.: 09/949,505

(22) Filed: Sep. 10, 2001

(51) Int. Cl.$^7$ ............................................. H01L 21/302
(52) U.S. Cl. ........................ 438/700; 438/719; 438/725
(58) Field of Search ................................. 438/700, 706, 438/710, 713, 714, 717, 719, 723, 724, 725, 745, 753, 756, 757

(56) References Cited

U.S. PATENT DOCUMENTS

| | | | |
|---|---|---|---|
| 5,804,088 A | * | 9/1998 | McKee ......................... 216/47 |
| 5,886,410 A | | 3/1999 | Chiang et al. ............... 257/759 |
| 5,910,453 A | | 6/1999 | Gupta et al. ................. 438/717 |
| 5,930,634 A | | 7/1999 | Hause et al. ................. 438/307 |
| 5,933,759 A | | 8/1999 | Nguyen et al. .............. 438/700 |
| 6,020,269 A | | 2/2000 | Wang et al. .................. 438/717 |
| 6,030,541 A | * | 2/2000 | Adkisson et al. ............. 216/51 |
| 6,069,091 A | * | 5/2000 | Chang et al. ................ 438/719 |
| 6,136,679 A | | 10/2000 | Yu et al. ...................... 438/592 |
| 6,156,629 A | * | 12/2000 | Tao et al. .................... 438/535 |
| 6,171,763 B1 | | 1/2001 | Wang et al. ................. 430/318 |
| 6,200,907 B1 | | 3/2001 | Wang et al. ................. 438/718 |
| 6,492,068 B1 | * | 12/2002 | Suzuki .......................... 430/5 |

\* cited by examiner

*Primary Examiner*—Kin-Chan Chen
(74) *Attorney, Agent, or Firm*—George O. Saile; Stephen B. Ackerman

(57) ABSTRACT

A new method is provided for the etch of ultra-small patterns in a silicon based surface. Under the first embodiment, a hardmask layer over a substrate and a layer of ARC over the hardmask layer are successively patterned. The patterned layer of ARC is removed, the remaining patterned hardmask layer is used as a mask for etching the substrate. Under the second embodiment, a first hardmask layer over a substrate, a second hardmask layer over the first hardmask layer and a layer of ARC over the second hardmask layer are successively patterned. The patterned layer of ARC and the second hardmask layer are removed, the remaining first patterned hardmask layer is used as a mask for etching the substrate.

26 Claims, 6 Drawing Sheets

METHOD OF ETCHING A SILICON CONTAINING LAYER USING MULTILAYER MASKS

BACKGROUND OF THE INVENTION (1) Field of the Invention

The invention relates to the fabrication of integrated circuit devices, and more particularly, to a method of etching a layer of semiconductor material that contains silicon for the era of sub-micron devices features.

(2) Description of the Prior Art

The continuing trend in the development of semiconductor devices is driven by the desire to improve device performance, which imposes the necessity of reducing device feature size. Feature size for sub-micron devices, such as line width for interconnect traces of channel lengths for gate electrodes for sub-micron devices, is in the range of 0.25 $\mu$m or less.

The methods that are applied for the creation of device features fundamentally makes use of layers of photoresist, which are patterned and developed such that the remaining photoresist mask exposes an underlying surface in a desired pattern. Methods of photolithography (or E-beam or X-ray lithography) are used to expose the surface of the layer of photoresist, thereby changing the molecular structure (solubility) of the photoresist in such a way that the exposed photoresist either remains in place or can be removed.

Increased and continuing miniaturization of semiconductor devices has placed increasingly stringent demands on the methods of exposure that are used to create these ever-smaller device features. To gain an optimum exposure of a layer of photoresist, it is required that the light of the exposure source, such as a source of UV light, is sharply focused (enabling the creating of patterns of very small size) combined with good focusing resolution (enabling the creating of closely spaced patterns) while an optimum depth of focus assures that the layer of photoresist is exposed over an equal depth over the surface of the layer of photoresist. In addition, scattering of light while or after this light strikes the target surface (the surface of the layer of photoresist) must be severely limited since such light diffusion affects the target layer (of photoresist) in an unpredictable manner and is counter to the requirement that the light beam is sharply focused. For the latter reason, light reflection must be eliminated or severely limited after the light strikes the surface of the layer of photoresist, including reflection of the incident light from underlying surfaces such as the surface of a layer of metal or of the substrate. One of the methods that has been employed to obtain improved results in creating ultra-small device features has improved the light source by selecting shorter wavelength light for this light source or by increasing the energy by which the light is radiated. This however leads to other problems such as the emitted light penetrating the target layer and further affecting underlying layers such as layers of insulation.

Another approach that has been followed by the industry is to address and correspondingly optimize the surface or surfaces on which the light that is generated by the exposure source impacts. For instance, the use of a layer of Anti Reflective Coating (ARC) has long been recognized and used to suppress reflection of incident light back through for instant a layer of photoresist, diluting both the required depth of focus and the focusing resolution.

One of the main impacts on the photolithographic process that is caused by reduced device feature size is that the thickness of the layer of photoresist that is used for the pattern generation must accordingly be reduced, this to meet requirements of depth of focus of the light in the layer of photoresist, since reflected light has a less detrimental effect in a thinner layers of photoresist. The invention addresses these concerns and provides a method of layer creation, forming part of creation patterns of sub-micron size that can be applied to the creation of high-speed, high performance semiconductor devices having sub-micron device features.

U.S. Pat. No. 6,156,629 (Tao et al.) and U.S. Pat. No. 6,200,907 (Wang et al.) show dual hard mask.

U.S. Pat. No. 6,200,907 (Wang et al.), U.S. Pat. No. 6,171,763 (Wang et al.), and U.S. Pat. No. 5,886,410 (Chiang et al.) show other dual hard masks.

U.S. Pat. No. 6,069,091 (Chang et al.), U.S. Pat. No. 6,030,541 (Adkisson), U.S. Pat. No. 5,933,759 (Nguyen et al.) are related patents.

SUMMARY OF THE INVENTION

A principle objective of the invention is to provide a method of creating a pattern for semiconductor devices having ultra-small devices feature size.

It is another objective of the invention to prevent tilting of a layer of ultra-thin photoresist after this layer of photoresist has been patterned and developed.

It is another objective of the invention to provide a method of patterning and etching silicon based layers of material wherein device features with a size of 0.07 $\mu$m or less are to be created.

In accordance with the objectives of the invention a new method is provided for the etch of ultra-small patterns in a silicon based surface. Under the first embodiment of the invention, a hard mask layer is deposited over the surface of the silicon-based layer, a coating of organic ARC is deposited over the surface of the hard mask layer. The layers of organic ARC and the hard mask layer are patterned and etched in accordance with a pattern of openings that needs to be created in the layer of silicon based material. The patterned layer of ARC is removed after which the layer of silicon based material is etched in accordance with the pattern created in the layer of hard mask material. Under a second embodiment of the invention, a first and a second layer of hard mask material are deposited over the surface of a silicon based layer, a layer of ARC is applied over the surface of the second layer of hard mask material. The layers of ARC and the second hard mask material are patterned and etched in accordance with a pattern of openings that is to be created in the silicon based layer. The patterned layer of ARC is removed after which the patterned second layer of hard mask material is used to etch the first layer of hard mask material. The patterned and etched second and first layers of hard mask material are then used to etch the silicon-based material.

BRIEF DESCRIPTION OF THE DRAWINGS

FIG. 1 shows a cross section of a silicon based surface over which have been deposited a layer of hard mask material over which has been deposited a layer of organic ARC. A patterned and developed layer of photoresist has been created on the surface of the layer of organic ARC.

FIG. 2 shows a cross section after the layer of ARC has been etched in accordance the photoresist mask of FIG. 1.

FIG. 3 shows a cross section after the layer of hard mask material has been etched in accordance the photoresist mask of FIG. 1.

FIG. 4 shows a cross section after the photoresist mask and the layer of ARC have been removed from the surface, leaving in place a patterned layer of hard mask material.

FIG. 5 shows a cross section after the layer of silicon based material has been etched in accordance with the pattern created in the layer of hard mask material, creating gate trenches.

FIG. 6 shows a cross section after the layer of silicon based material has been etched in accordance with the pattern created in the layer of hard mask material, creating STI trenches.

FIG. 7 shows a cross section of a silicon based surface over which have been deposited a first layer of hard mask material over which a second layer of hard mask material has been deposited over which a layer of ARC has been deposited. A patterned and developed layer of photoresist has been created on the surface of the layer of ARC.

FIG. 8 shows a cross section after the layer of ARC has been etched in accordance the photoresist mask of FIG. 7.

FIG. 9 shows a cross section after the second layer of hard mask material has been etched in accordance the photoresist mask of FIG. 7.

FIG. 10 shows a cross section after the photoresist mask and the layer of ARC have been removed from the surface, leaving in place a patterned second layer of hard mask material.

FIG. 11 shows a cross section after the first layer of hard mask material has been etched in accordance with the pattern created in the second layer of hard mask material.

FIG. 12 shows a cross section after the layer of silicon based material has been etched in accordance with the pattern created in the second and first layer of hard mask material, creating gate trenches.

FIG. 13 shows a cross section after the layer of silicon based material has been etched in accordance with the pattern created in the second and first layer of hard mask material, creating STI trenches.

DESCRIPTION OF THE PREFERRED EMBODIMENTS

Figure 1:
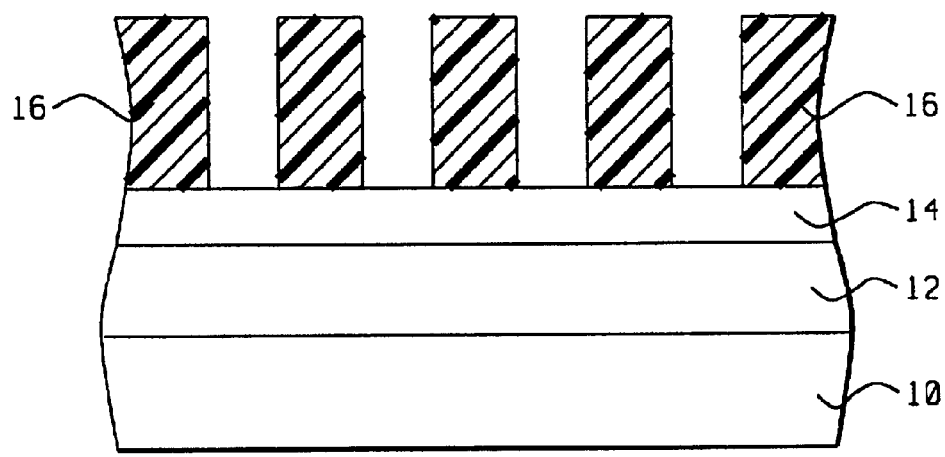
FIGS. 1 through 6 address the first embodiment of the invention, as follows.

In order to provide a base for comparison of the instant invention with previous methods that have been provided, a short analysis will first be performed of some of the previous methods.

U.S. Pat. No. 6,606,091, (Chang et al), titled "In-situ Sequential Silicon Containing Hard Mask Layer/Silicon layer Plasma Etch method" follows the sequence:
   starts with a bare substrate
   deposits a blanket layer containing silicon over the surface of the substrate
   deposits a layer of hard mask material of the layer containing silicon
   deposits and develops a layer of photoresist over the surface of the layer of hard mask, creating a photoresist mask having an opening that aligns with the pattern of an opening that has to be created in the layer containing silicon
   etches through the hard mask layer in accordance with the overlying photoresist mask, and
   partially etches through the silicon containing layer.

In a later processing sequence, a layer of pad oxide is placed over the silicon containing oxide while the silicon containing layer is replaced with the surface of a silicon substrate. The layers of hard mask and the layer of pad oxide are etched, as previously indicated, the partial etching of the silicon containing layer now is the etching of a trench in the surface of the silicon substrate.

From the above brief analysis it can be concluded that U.S. Pat. No. 6,606,091:
   applies only to etching a trench in the surface of a silicon containing layer such as the surface of a silicon substrate
   does not make use of a layer of ARC, and
   during the etching of the layers underlying the layer of hard mask, the photoresist mask remains in place and forms part of the patterning interface.

U.S. Pat. No. 6,030,541 (Adkisson et al.), titled: Process For Defining A Pattern Using an Anti-Reflective Coating and Structure Therefore", provides for:
   providing a substrate
   depositing a first layer of hard mask material, containing silicon dioxide, and a second layer of hard mask material over the surface of the substrate
   depositing a layer of ARC, containing SiON, over the surface of the layer of hard mask material
   depositing and developing a layer of photoresist over the second layer of ARC creating a photoresist mask having an opening that aligns with the surface of the substrate in which an opening is to be created
   etching the layers of ARC and second hard mask layer in accordance with the photoresist mask
   removing the photoresist mask and the layer of ARC, leaving in place the second layer of hard mask, the second layer of hard mask having an opening therein in accordance with the opening created in the layer of photoresist, and
   etching the first layer of hard mask in accordance with the opening that has been created in the second layer of hard mask; this latter etch is the desired etch since the first layer of hard mask can comprises a layer of polysilicon, thus creating a gate structure.

From the above it can be concluded that U.S. Pat. No. 6,030,541:
   is applied for a gate etch
   uses a dielectric (SiON) for the layer of ARC
   uses silicon dioxide for the layer of hard mask, and
   removes, prior to the etching of the first hard mask layer, the layers of photoresist and ARC.

Figure 2:
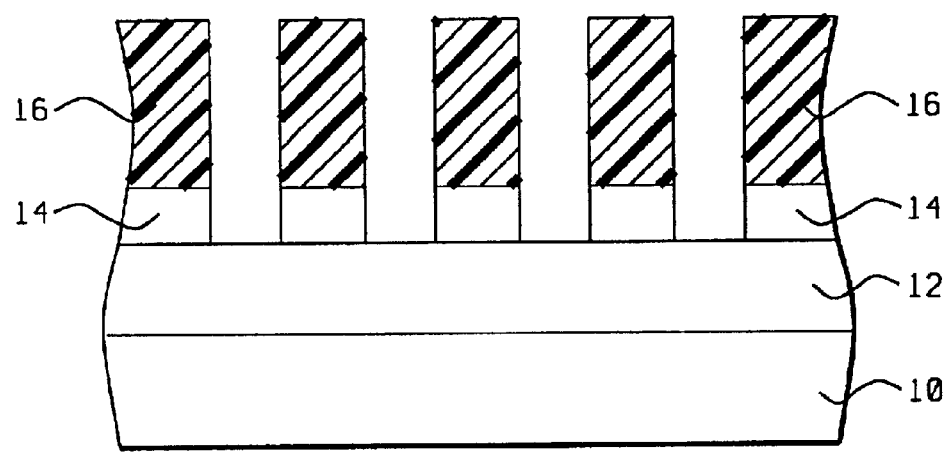
Figure 3:
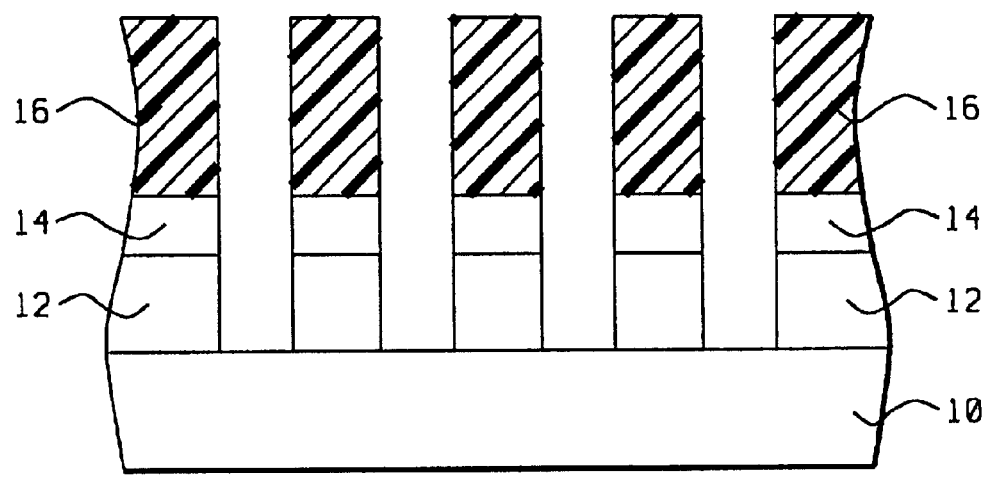
Figure 4:
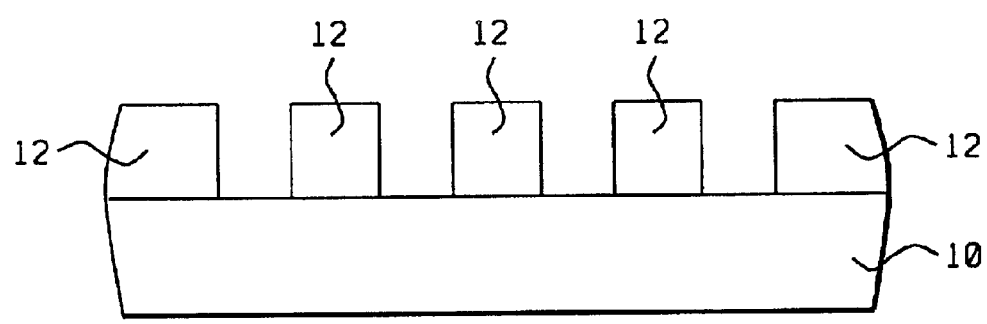
Figure 5:
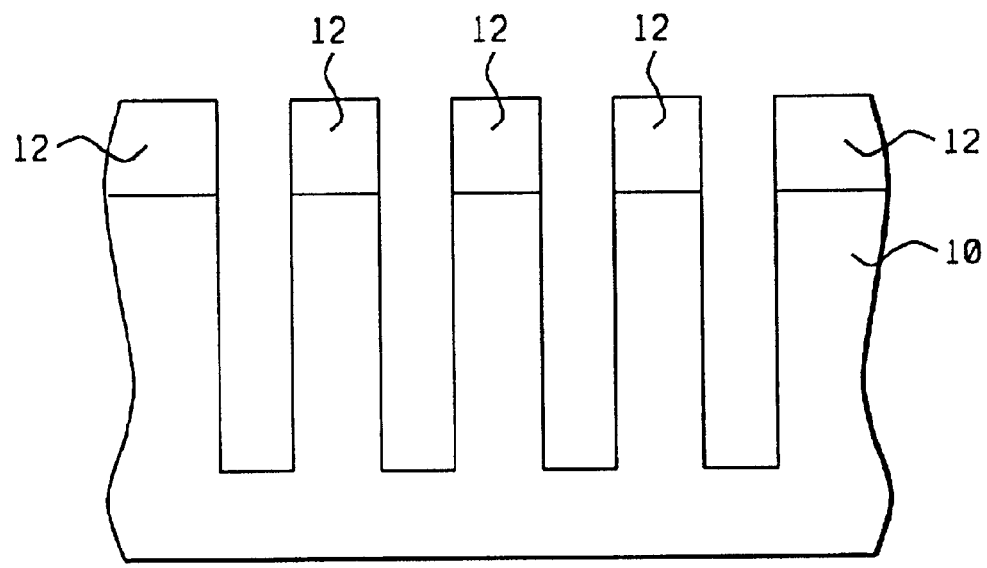
Figure 6:
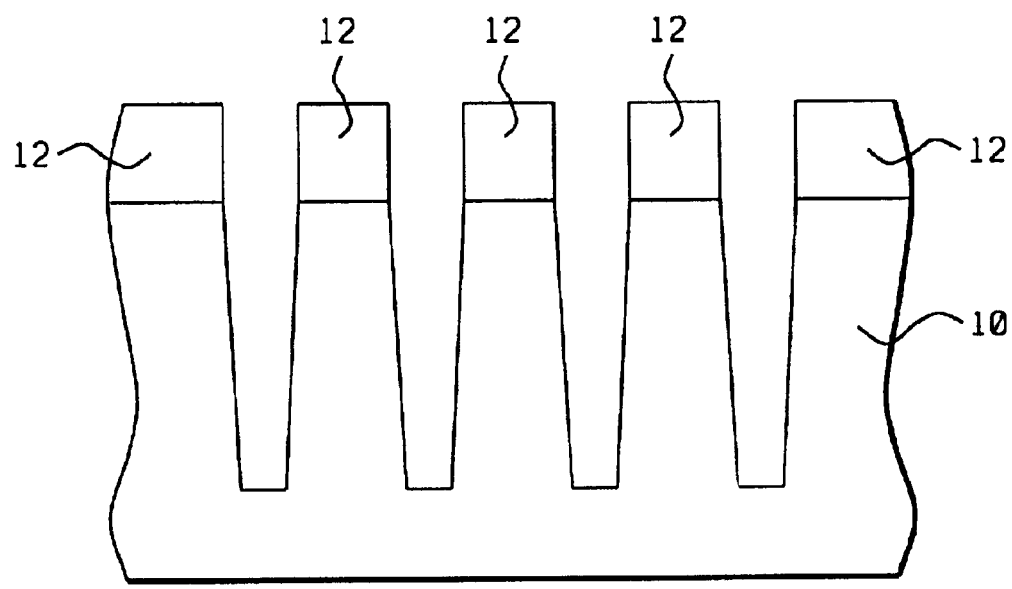

The invention provides, under a first embodiment of the invention, for the following processing steps, see FIG. 1:
   a silicon based layer 10, which may be the surface of a single crystalline silicon substrate, poly crystalline silicon substrate or silicon germanium substrate
   a layer 12 of hard mask material is deposited over the silicon based layer 10
   a layer 14 of organic Anti Reflective Coating material is deposited over the surface of the layer 12 of hard mask material
   a layer 16 of photoresist is coated over the surface of the layer 14 of organic ARC, the layer 16 of photoresist is patterned and developed creating a photoresist mask having a pattern of openings that aligns with a pattern of openings that are to be created in the underlying silicon based layer 10
   the organic layer 14 of ARC is etched, FIG. 2, in accordance with the pattern of openings created in the layer 16 of photoresist the hard mask layer 12 is etched, FIG. 3, in accordance with the pattern of openings created in the layer 16 of photoresist the layers of developed photoresist 16 and the etched layer 14 of ARC are removed from the surface of the hard mask layer, FIG. 4, and the silicon base layer 10 is etched in accordance with the openings that have been etched through the layer of hard mask material; this latter etch can be a trench or gate etch, FIG. 5, creating openings in the layer 10 that have vertical sidewalls or can be a STI etch, FIG. 6, creating openings in layer 10 that have sloping sidewalls.

Figure 7:
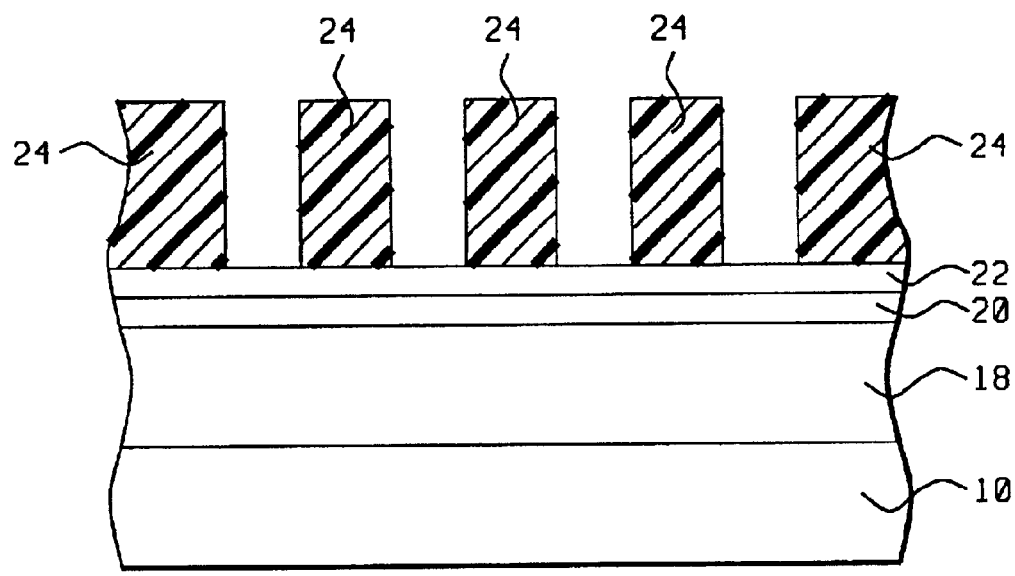
FIGS. 7 through 13 address the second embodiment of the invention, as follows.
Figure 8:
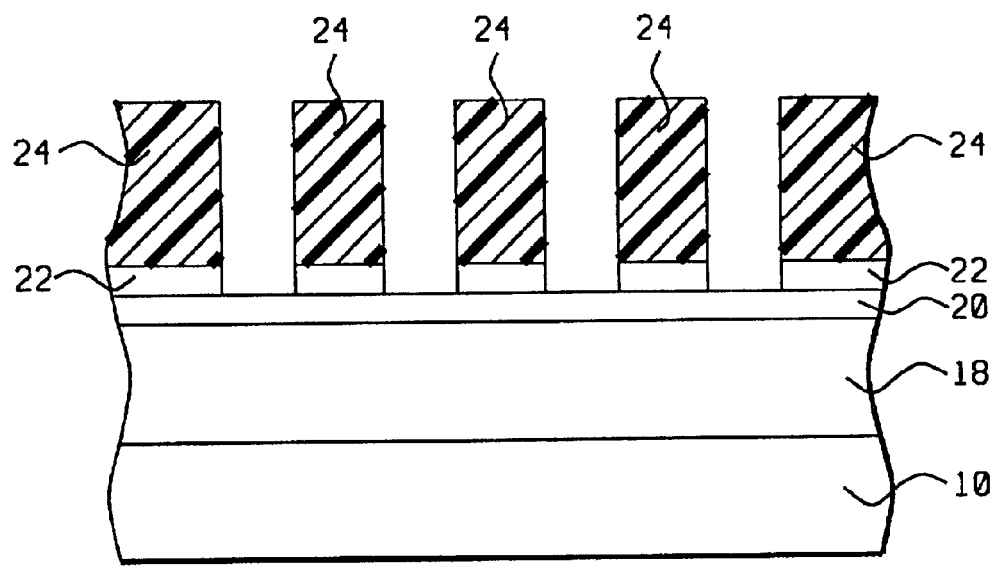
Figure 9:
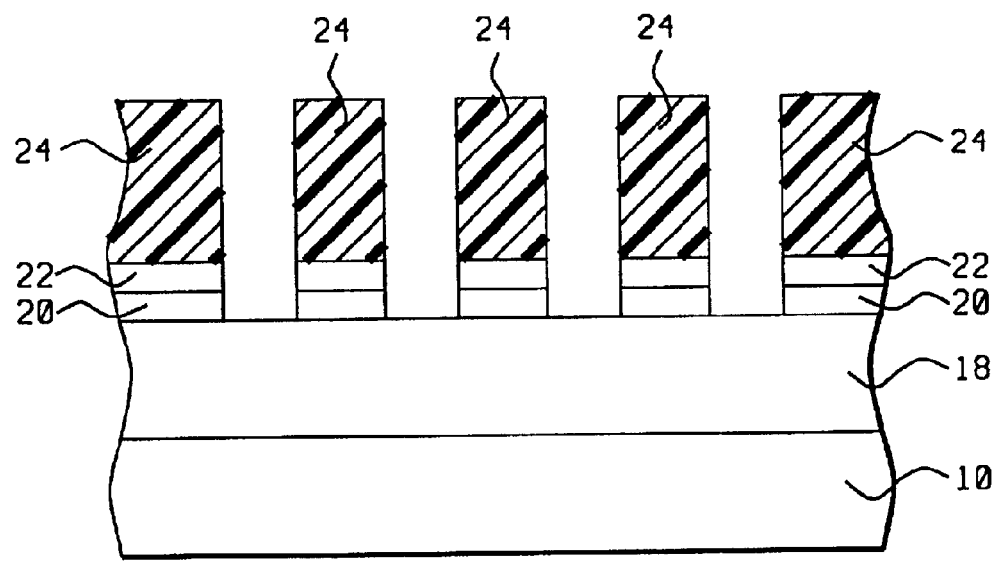
Figure 10:
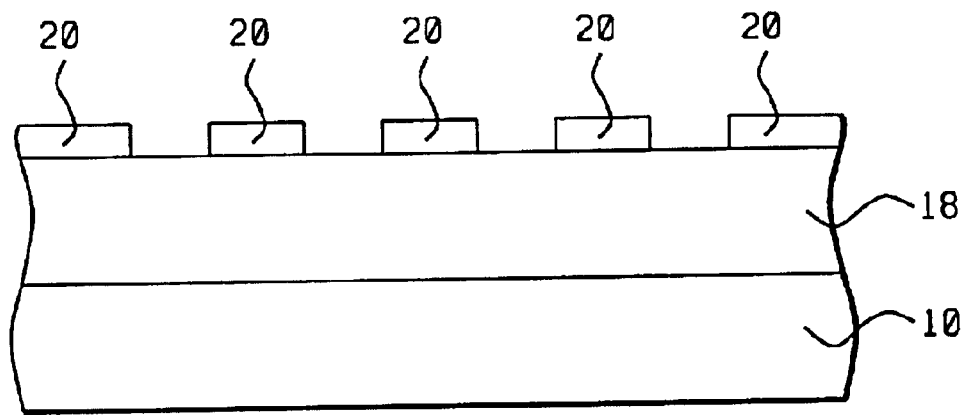
Figure 11:
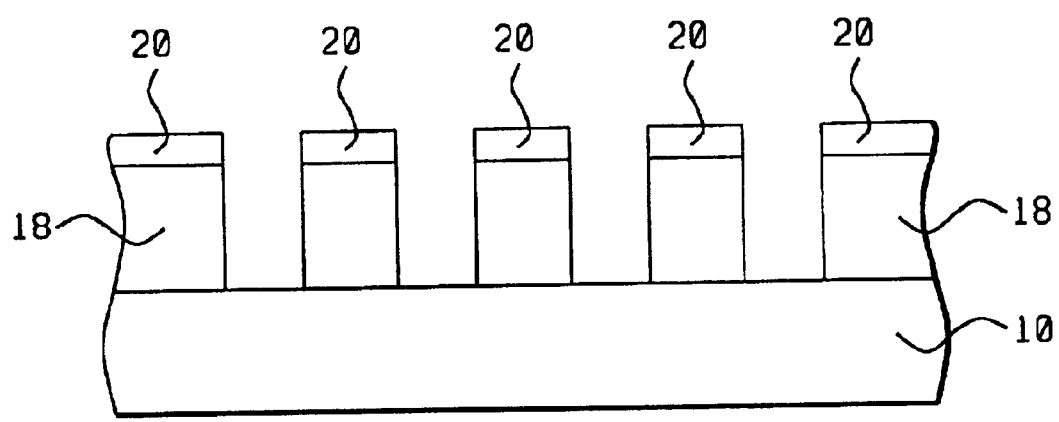
Figure 12:
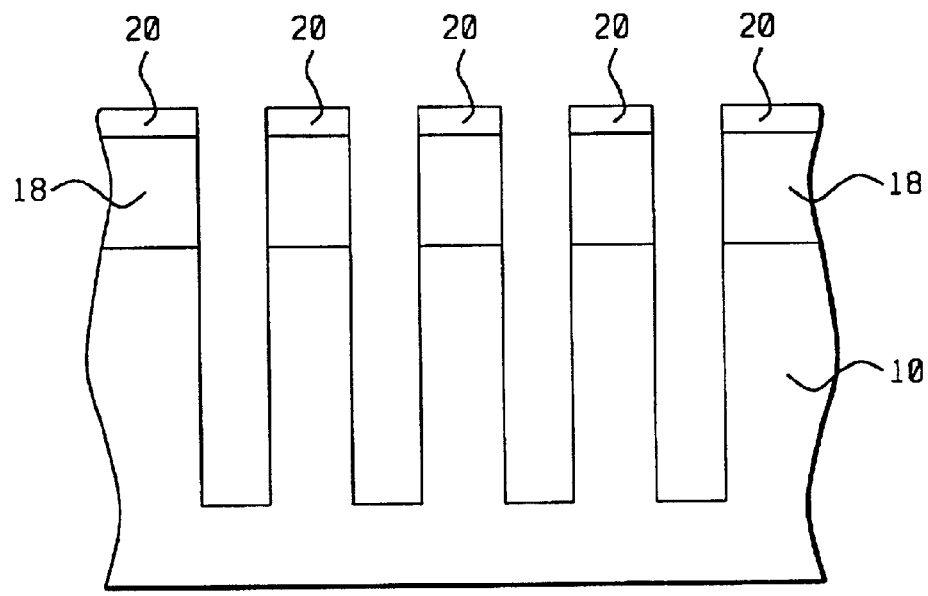
Figure 13:
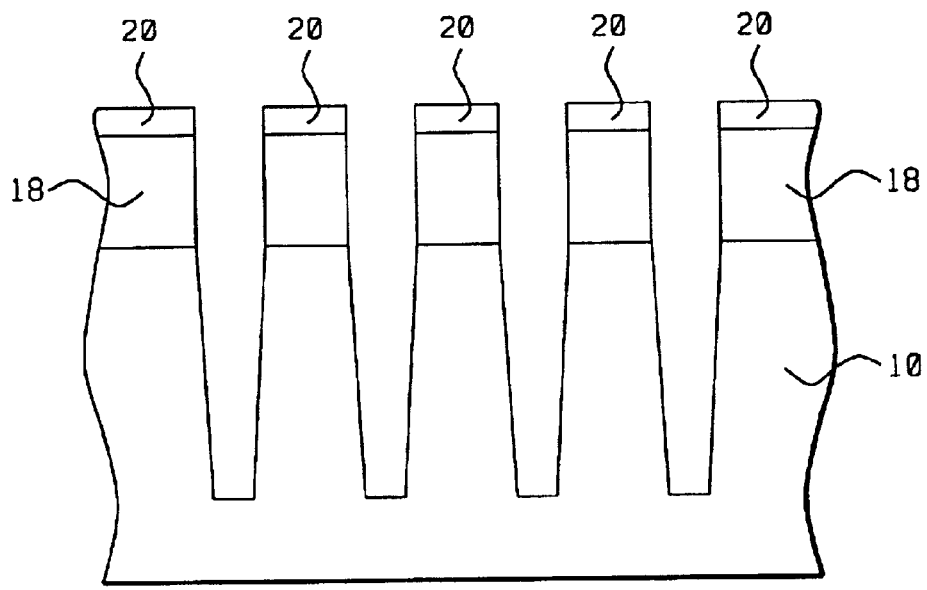

The invention provides, under a second embodiment of the invention, for the following processing steps, see FIG. 7:

a silicon based layer 10, which may be the surface of a single crystalline silicon substrate, a poly crystalline silicon substrate or silicon germanium substrate a first layer 18 of hard mask material, deposited over the silicon based layer 10; the first hard mask layer 18 comprises a thick silicon based layer with an underlying thin layer of silicon dioxide a second hard mask layer 20, deposited over the surface of the first hard mask layer 18; the second hard mask layer 20 comprises silicon dioxide and amorphous silicon a layer 22 of ARC material deposited over the surface of the second hard mask layer 20; the layer 22 of ARC comprises organic ARC and inorganic silicon oxynitride a layer 24 of photoresist is coated over the surface of the layer 22 of ARC material, the layer 24 of photoresist is patterned and developed creating a photoresist mask having a pattern of openings that aligns with a pattern of openings that are to be created in the underlying silicon based layer 10; methods that are used for the patterning and developing of layer 24 of photoresist include methods of photolithography, E-beam lithography and X-ray lithography the layer 22 of ARC is etched, FIG. 8, in accordance with the pattern of openings created in the layer 24 of photoresist, applying dry etching the second hard mask layer 20 is etched, FIG. 9, in accordance with the pattern of openings created in the layer 24 of photoresist; the etching of the second hard mask layer 20 applies methods of ex-situ and in-situ etch processing the layers of developed photoresist 24 and the etched layer 22 of ARC are removed from the surface of the first hard mask layer 20, FIG. 10; the removing of the developed layer 24 of photoresist 24 and the etched layer 22 of ARC material applies methods of ex-situ and in-situ etch processing the first hard mask layer 18 is etched, FIG. 11, in accordance with the pattern of openings created in the second hard mask layer 20, the etching of the first hard mask layer 18 applies methods of ex-situ and in-situ etch processing, and the silicon base layer 10 is etched, FIG. 12, in accordance with the openings that have been etched through the first layer 20 of hard mask material, using methods of ex-situ and in-situ etch processing; this latter etch of the silicon base layer 10 can be a trench/gate etch, FIG. 12, creating openings in the layer 10 that have vertical sidewalls or can be a STI etch, FIG. 13, creating openings in layer 10 that have sloping sidewalls.

The method of the invention of patterning a silicon based layer by applying an etch process, can be summarized as follows:

the invention starts with a silicon based layer, the silicon based layer can comprise a single crystalline silicon substrate or a poly crystalline silicon substrate or a silicon germanium substrate a first layer of hard mask material, comprising a thick silicon nitride layer with an underlying thin layer of silicon dioxide, is deposited over the surface of the silicon based layer a second layer of hard mask material, comprising silicon dioxide or amorphous silicon, is deposited over the surface of the first layer of hard mask material a layer of Anti Reflective Coating (ARC) material, comprising organic or inorganic silicon oxynitride, is deposited over the surface of the second hard mask layer a layer of photoresist, comprising a photoresist that is selected from the group consisting of UV and DUV photolithography photoresist and E-beam resist and X-ray resist, is coated over the surface of the layer of ARC material the layer of photoresist is patterned and developed, creating a photoresist mask having a pattern of openings that aligns with a pattern of openings that are to be created in the underlying silicon based layer the layer of ARC is etched in accordance with the pattern of openings created in the layer of photoresist, by applying dry etching the second hard mask layer is etched in accordance with the pattern of openings created in the layer of photoresist, the etching of the second hard mask layer applying dry or wet ex-situ etch processing or in-situ etch processing the layers of developed photoresist and the etched layer of ARC are removed from the surface of the first hard mask layer using ex-situ or in-situ plasma ashing or wet chemical strip processing etch processing the first hard mask layer is etched, using ex-situ or in-situ etch dry or wet etch processing, in accordance with the pattern of openings created in the second hard mask layer, and the silicon base layer is trench or gate etched, using ex-situ or in-situ etch dry etch or wet etch processing, in accordance with the openings that have been etched through the first layer of hard mask material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of patterning a silicon based layer for semiconductor devices having ultra-small devices feature size by applying an etch process, comprising the steps of:

providing a silicon based layer;

depositing a layer of hard mask material over said silicon based layer;

depositing a layer of organic Anti Reflective Coating (ARC) material over said layer of hard mask material;

coating an ultra-thin layer of photoresist over the layer of organic ARC;

patterning and developing the ultra-thin layer of photoresist, creating a ultra-thin photoresist mask having a pattern of openings that aligns with a pattern of openings that are to be created in the underlying silicon based layer, said patterning and developing the layer of photoresist comprising photolithography processing, E-beam lithography processing or X-ray lithography processing, thereby preventing tilting of the patterned layer of ultra-thin photoresist which is further enhanced by the ultra-thin nature of the layer of photoresist;

etching the organic layer of ARC in accordance with the pattern of openings created in the layer of photoresist;

etching the hard mask layer in accordance with the pattern of openings created in the layer of photoresist;

removing the layers of developed ultra-thin photoresist and the etched layer of organic ARC from the hard mask layer; and etching the silicon based layer in accordance with the openings that have been etched through the layer of hard mask material, thereby creating a pattern in said silicon based layer for semiconductor devices having ultra-small devices feature size of 0.07 µm or less.

2. The method of claim 1 wherein said etching the silicon based layer is a trench or gate etch thereby creating openings in the silicon based layer that have vertical sidewalls or is a Shallow Trench Isolation thereby creating openings in the silicon based layer that have sloping sidewalls.

3. The method of claim 1, wherein said layer of hard mask material is silicon dioxide, silicon nitride with an underlying layer of silicon dioxide or composites of silicon dioxide and silicon nitride with an underlying layer of silicon dioxide.

4. The method of claim 1, wherein said etching the organic layer of ARC is dry etch processing or wet chemical etch processing.

5. The method of claim 1, wherein said etching the hard mask layer is dry etch processing or wet chemical etch processing.

6. The method of claim 1, wherein said removing the layers of developed photoresist and the etched layer of organic ARC is plasma ashing or wet chemical strip processing.

7. The method of claim 6, wherein said plasma etching is in-situ plasma processing.

8. The method of claim 1, wherein said etching the silicon based layer is dry etch processing or wet etch processing.

9. The method of claim 1, wherein said silicon based layer is a single crystalline silicon substrate, a poly crystalline silicon substrate or a silicon germanium substrate.

10. A method of patterning a silicon based layer for semiconductor devices having ultra-small devices feature size by applying an etch process, comprising the steps of:

providing a silicon based layer;

depositing a first layer of hard mask material over said silicon based layer;

depositing a second layer of hard mask material over said first layer of hard mask material;

depositing a layer of Anti Reflective Coating (ARC) material over the second hard mask layer;

coating an ultra-thin layer of photoresist over the layer of ARC material;

patterning and developing the ultra-thin layer of photoresist, creating a photoresist mask having a pattern of openings that aligns with a pattern of openings that are to be created in the underlying silicon based layer, said patterning and developing comprising methods of photolithography, E-beam lithography and X-ray lithography, thereby preventing tilting of the patterned layer of ultra-thin photoresist which is further enhanced by the ultra-thin nature of the layer of photoresist;

etching the layer of ARC in accordance with the pattern of openings created in the layer of photoresist;

etching the second hard mask layer in accordance with the pattern of openings created in the layer of photoresist;

removing the layer of developed photoresist and the etched layer of ARC from the first hard mask layer;

etching the first hard mask layer in accordance with the pattern of openings created in the second hard mask layer; and etching the silicon based layer in accordance with the openings that have been etched through the first layer of hard mask material, thereby creating a pattern in said silicon based layer for semiconductor devices having ultra-small devices feature size of 0.07 µm or less.

11. The method of claim 10, wherein said etching the silicon based layer is a trench or a gate etch thereby creating openings in the silicon based layer that have vertical sidewalls or is a Shallow Trench Isolation thereby creating openings in the silicon based layer that have sloping sidewalls.

12. The method of claim 10, wherein said patterning and developing the layer of photoresist is photolithography processing, E-beam lithography processing or X-ray lithography processing.

13. The method of claim 10, wherein said etching the second hard mask layer in accordance with the pattern of openings created in the layer of photoresist is dry etch processing or wet etch processing.

14. The method of claim 10, wherein said removing the layers of developed photoresist and the etched layer of organic ARC is plasma ashing or wet chemical strip processing.

15. The method of claim 10, wherein said etching the first hard mask layer in accordance with the pattern of openings created in the second hard mask layer is dry etch processing or wet etch processing.

16. The method of claim 10, wherein said etching the silicon based layer is dry etch processing or wet etch processing.

17. The method of claim 10, wherein said silicon based layer is a single crystalline silicon substrate, a poly crystalline silicon substrate or a silicon germanium substrate.

18. The method of claim 10, wherein said first hard mask layer is a silicon nitride layer with an underlying layer of silicon dioxide.

19. The method of claim 10, wherein the second hard mask layer is silicon dioxide or amorphous silicon.

20. The method of claim 10, wherein the layer of ARC is organic ARC or inorganic silicon oxynitride.

21. The method of claim 10, wherein said layer of photoresist is UV photolithography photoresist, DUV photolithography photoresist, E-beam photoresist or X-ray photoresist.

22. The method of claim 10, wherein the etching of the second hard mask layer is in-situ etch processing.

23. The method of claim 10, wherein removing of the layer of developed photoresist and the etched layer of ARC is in-situ etch processing.

24. The method of claim 10, wherein etching the first hard mask layer is in-situ etch processing.

25. The method of claim 10, wherein etching the silicon based layer is in-situ etch processing.

26. The method of claim 10, said etching the layer of ARC in accordance with the pattern of openings created in the layer of photoresist comprises applying dry etching.

* * * * *